United States Patent [19]

Van Zeeland

[11] 4,199,694
[45] Apr. 22, 1980

[54] TERMINAL CONVERTIBLE ALTERNATING CURRENT SWITCH

[75] Inventor: Donald L. Van Zeeland, Franklin, Wis.

[73] Assignee: Eaton Corporation, Cleveland, Ohio

[21] Appl. No.: 933,511

[22] Filed: Aug. 14, 1978

[51] Int. Cl.² .................. H03K 17/72; H03K 17/02
[52] U.S. Cl. ..................... 307/252 J; 307/252 N; 307/252 UA; 307/310
[58] Field of Search ............ 307/239, 241, 252 N, 307/252 P, 252 UA, 310, 252 J; 361/190; 219/494, 497

[56] References Cited

U.S. PATENT DOCUMENTS

| | | | |
|---|---|---|---|
| 3,474,258 | 10/1969 | Nagy, Jr. | 219/497 |
| 3,736,443 | 5/1973 | Striggow | 307/252 N |
| 4,002,882 | 1/1977 | McCutchen | 219/497 |
| 4,013,872 | 3/1977 | Glass | 219/494 |

Primary Examiner—John Zazworsky
Attorney, Agent, or Firm—Hugh R. Rather; William A. Autio

[57] ABSTRACT

An electronic A.C. switch which affords either "normally open" or "normally closed" type of operation to a connected alternating current source and load in accordance with which of two alternate terminals such source and load are connected in addition to a third common terminal. Its operation is automatically inhibited in the event the A.C. source and load are connected to both of such alternate terminals simultaneously. It can be used with a wide variety of electrical sensor devices for effecting its operation between either of its normal and opposite circuit states.

9 Claims, 1 Drawing Figure

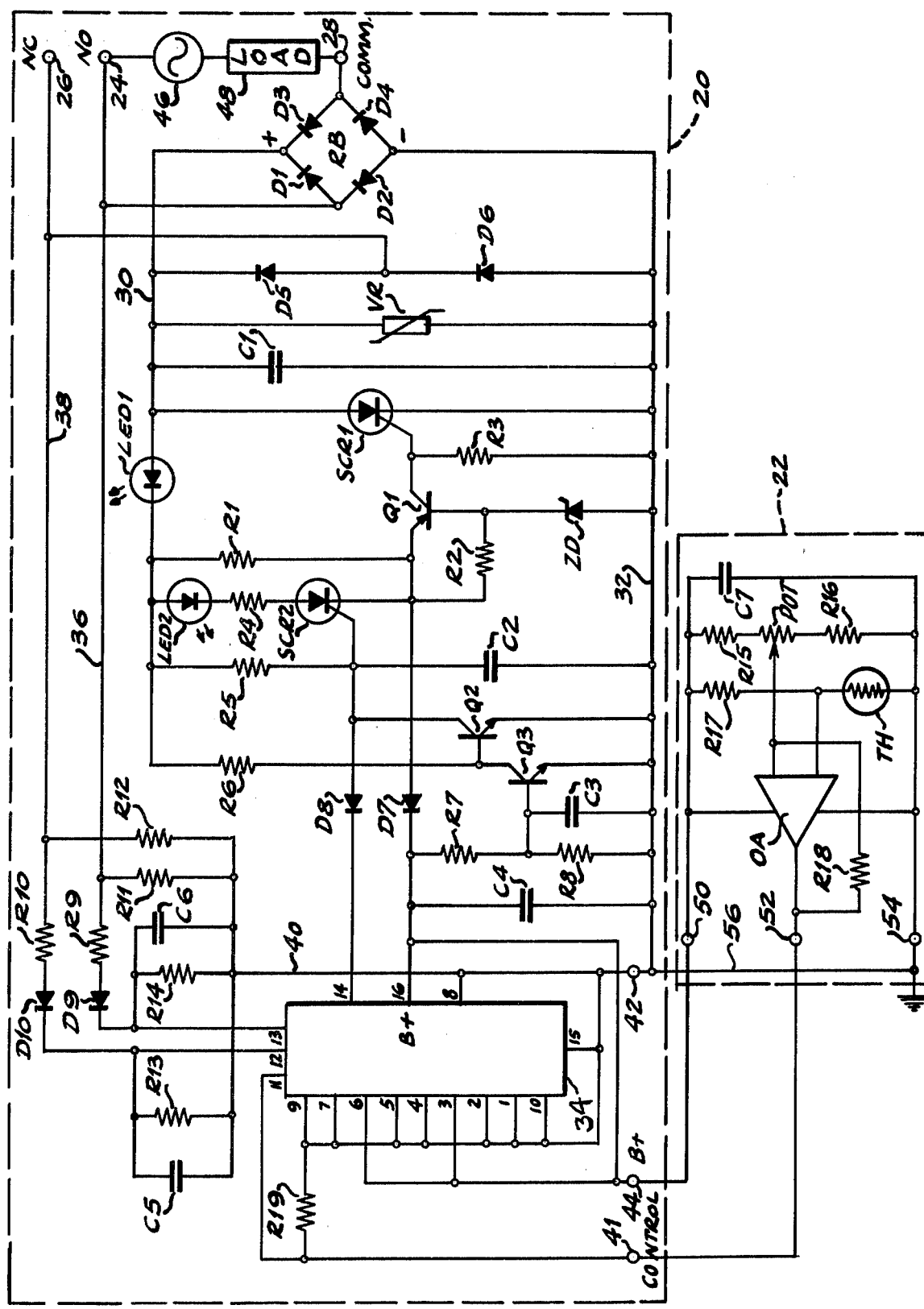

TERMINAL CONVERTIBLE ALTERNATING CURRENT SWITCH

BACKGROUND OF THE INVENTION

There are presently electronic switches which may be used as "limit switches" when triggered by ambient condition sensors. In order for such switches to be converted from what is known as "normally open" or "normally closed" circuit states they either must be provided with a reconnectable "jumper" wire or have the equivalent of a mechanical switch as a part thereof. Such arrangements can cause confusion and complicate field type changes in desired normal operating states.

OBJECTS OF THE INVENTION

It is a primary object of the present invention to provide an improved electronic A.C. switch which can be readily changed from a "normally open" to a "normally closed" type of operation without need for auxiliary "jumpers", mechanical switches or the like.

A more specific object is to provide an electronic switch of the aforementioned type which can be selected for "normally open" or "normally closed" operation merely by connecting one end of the A.C. load circuit appropriately to one or the other of two alternate load terminals.

A further specific object of the invention is to provide an electronic switch which is inhibited from changing state in the event the aforementioned end of a load circuit is connected to both of such alternate load terminals simultaneously.

Other objects and advantages of the invention will hereinafter appear.

BRIEF DESCRIPTION OF THE DRAWINGS

The single FIGURE of the drawing schematically depicts the electronic switch of the present invention as used with a thermal sensor.

DESCRIPTION OF THE PREFERRED EMBODIMENT

Referring to the drawing it shows the convertible A.C. switch of the invention depicted schematically within the broken line box 20, and a temperature sensor similarly shown in the broken line rectangle 22.

The switch 20 has a "normally open" A.C. terminal 24, a "normally closed" A.C. terminal 26, and a "common" A.C. terminal 28. Terminal 24 is connected through a diode D1 of a full wave rectifier bridge RB to the anode of a light emitting diode LED1. The cathode of LED1 is connected in series with resistors R1 and R2 and a zener diode ZD to a ground bus 32. The normally closed terminal 26 is connected to the anode of LED1 through a diode D5. The common terminal 28 is connected to the anode of LED1 through diode D3 of bridge RB. Ground bus 32 is connected to N.O. terminal 24 through diode D2 of bridge RB, to N.C. terminal 26 through diode D6, and to common terminal 28 through diode D4.

The emitter terminal of a P-N-P transistor Q1 is connected to the point common between resistors R1 and R2, and the collector terminal of that transistor is connected to the control electrode of a silicon controlled rectifier SCR1. The base of Q1 is connected to the point common between resistor R2 and the cathode of diode ZD. The anode of SCR1 is connected to bus 30 and its cathode is connected to ground bus 32. A capacitor C1 and varistor VR are connected between buses 30 and 32 in parallel with the main conducting path of SCR1 and afford the latter transient voltage protection. A relatively low resistance resistor R3 is connected between the point common between the collector of Q1 and the control electrode of SCR1.

A light emitting diode LED2 is connected at its anode to the cathode of LED1 and from its cathode in series with a resistor R4 and the anode-cathode circuit of a silicon controlled rectifier SCR2 to the point common between resistors R1 and R2 and the emitter of Q1. A resistor R5 is connected between the anode of LED2 and the control electrode of SCR2. A capacitor C2 is connected between the control electrode of SCR2 and ground bus 32.

The collector of an N-P-N transistor Q2 is connected to the point common between resistor R5, capacitor C2 and the control electrode of SCR2, and the emitter of Q2 is connected to ground bus 32. The cathode of LED1 is additionally connected through a resistor R6 and the collector-emitter circuit of an N-P-N transistor Q3 to ground bus 32. The base of Q2 is connected to the point common between resistor R6 and the collector of Q3.

A diode D7 is connected at its anode to the point common between resistors R1 and R2, the emitter of Q1 and cathode of SCR2, and is connected at its cathode to the terminal 16 of a signal gater module 34. A voltage divider comprising series connected resistor R7 and R8 are connected between the cathode of diode D7 and ground bus 32. The base of transistor Q3 is connected to the point common between resistors R7 and R8. A capacitor C3 is connected between the base of Q3 and ground bus 32, and a capacitor C4 is connected between the point common between the anode of D7, resistor R7 and terminal 16 of module 34.

The point common between the control electrode of SCR2, resistor R5, capacitor C2 and collector of Q2 is connected in series with a diode D8 to the signal output terminal 14 of module 34. Module 34 is an integrated circuit device which in a preferred form is a Motorola MC14512, 8 input Multiplexer, such as that shown and described at page 7-179 of Motorola's "Vol. 5 MC MOS Integrated Circuits (1975)." As will hereinafter be explained module 34 is used in the switch of the present invention as a signal gater.

Normally open terminal 24 of the switch is connected through a conductor 36, in series with a resistor R9 and diode D9 to an input terminal 13 of module 34. Normally closed terminal 26 is connected through a conductor 38 in series with a resistor R10 and a diode D10 to an input terminal 12 of module 34.

A resistor R11 is connected between conductor 36 and a conductor 40 which is connected to ground bus 32, and a resistor R12 is similarly connected from conductor 38 to conductor 40. A parallel combination of a capacitor C5 and a resistor R13 are connected between the point common between the cathode of D10 and input terminal 12 of module 34. Similarly a parallel combination of a capacitor C6 and a resistor R14 is connected to the point common between the cathode of D9 and input terminal 13.

Module 34 has a control input terminal 11 connected to a switch control input terminal 41. Channel input terminals 1, 2, 4, 5, 7 and 9, ground terminal 8, inhibit terminal 10 and disable terminal 15 of module 34 are all connected to ground terminal 42 of the switch which is also connected to ground bus 32. A resistor R19 is connected between the point common to terminals 11 and 41 and the terminals 1 to 5, 7 to 10 and 15. Channel input terminals 3 and 6 are connected to the B+ terminal 44 of the switch which has cconnection to the point common between diode D7 and the B+ input terminal 16 of module 34.

Let it be assumed that an alternating current source 46 and a load 48 are connected between normally open contact 24 and common terminal 28 as shown. On each corresponding half cycle a small rectified current will flow from source 46 through terminal 24, diode D1 to D.C. bus 30 and on alternate half cycles current will flow from source 46, through load 48, terminal 28 and diode D3 to bus 30. Accordingly, rectified current will flow through LED1 causing the latter to illuminate to indicate that power is "on". From LED1 current will flow through resistors R1 and R2 and diode ZD, ground bus 32 and diode D4 back to common terminal 28. On alternate corresponding half cycles rectified current will flow from source 46, through load 48, terminal 28, diode D3, LED1, resistors R1 and R2, diode ZD and diode D2 to terminal 24.

The small rectified current that flows through resistors R1 and R2 and diode ZD establishes a bias on the base of transistor Q1 which conducts some current through its emitter-collector circuit and through resistor R3 to bus 32. This small current flow through transistor Q1 and resistor R3 is insufficient to effect turn-on of SCR1.

Rectified current also flows from LED1 through the resistors R5 and R6. The current through resistor R5 at this point is insufficient to render SCR2 conducting, because in the switch "off" state the terminal 14 of module 34 is at "0" or its low potential state which holds the control electrode of SCR2 below its firing potential. Before the 7.5 voltage bias is established at the anode of diode D7, current flows through the latter, and capacitor C4 to ground bus 32 to thereby charge the latter to 7.5 volts so that terminal 16 of module 34 is maintained at 7.5 volts.

Rectified current also flows from the A.C. source 46 resistor R9 and diode D9 into input terminal 13 of module 34. With this input state the potential state at output terminal 14 of the module will be caused to correspondingly follow the potential state existing at control signal input terminal 41. In other words, if the potential impressed at terminal 41, and hence at terminal 11, is a "1" or "high" then the potential at terminal 14 will be at a "1" or "high" also. On the other hand, if the potential at terminal 11 is "0" or "low" then terminal 14 will be at "0" or "low" potential.

When the D.C. potential at terminal 14 is caused to go from "0" to "1", it causes the control electrode of SCR2 to rise to a potential rendering the latter conducting. When SCR2 becomes conducting increased rectified current flows from the cathode of LED1 through LED2, resistor R4, SCR2 and the emitter-collector circuit of transistor Q1 which triggers SCR1 into conduction. The current flow through LED2 causes the latter to illuminate and provide an indication that the switch 20 is in its "on" state.

When SCR1 is conducting main energizing current then flows through load 48. On corresponding half cycles the main energizing current flows from source 46 into terminal 24, then through diode D1, SCR1, diode D4, terminal 28 and load 48 back to source 46. On alternate corresponding half cycles main energizing current flows from source 46 through load 48, into terminal 28, then through diode D3, SCR1, diode D2 and back through terminal 24 to source 46.

When SCR1 is conducting only 3 volts is available to maintain the B+ bias at terminal 16 of module 34 and at terminal 44 of the switch. However, when SCR1 turns "off" at each pulse zero crossing it is not permitted to turn on again until the succeeding half wave rises from 0 to 50 volts which encompasses the first 15° of such pulses. During each such initial 15° of the pulse period charging current flows from SCR2 through diode D7, capacitor C4 to replenish the charge on the latter and hence bring the D.C. potential at terminals 16 and 42 back up to 7.5 volts. After the charge on C4 is replenished current from SCR2 then again flows through the emitter-collector circuit of transistor Q1 which causes SCR1 to be again triggered into conduction. The latter then conducts for the remaining 75° of each half wave current pulse.

Let it now be assumed that instead of source 46 and load being connected as shown in the drawing that the upper end of source is connected to the normally closed terminal 26. Then whenever the potential state at terminal 14 is at its "0" state, a small rectified current will flow on corresponding half cycles from source 46, through terminal 26, diode D5, LED1, resistors R1 and R2, zener diode ZD and diode D4, terminal 28 and load 48. On alternate corresponding half cycles such current will flow from source 46, through load 48, terminal 28, diode D3, LED1, resistors R1 and R2, ZD, diode D6 and terminal 26 back to source 46. It will be apparent that a B+ potential of 7.5 volts will thus be maintained on terminal 16 of module 34 and at terminal 44.

With source 46 connected to terminal 26 a small current will also flow through conductor 38, resistor R10 and diode D10 into terminal 12 of module 34. The latter terminal is then maintained in its "1" or "high" state. Under this potential state of terminal 12, the potential state existing at output terminal 14 will be the inverse of that existing at control input terminals 41 and 11. In other words, if terminal 11 is in its "0" state, terminal 14 will be in its "1" state. If terminal 11 shifts from a "0" to a "1" state, the potential at terminal 14 will shift from a "1" to a "0" state. Accordingly, if terminal 14 is normally in a "1" state SCR2 will be triggered on, and cause SCR1 to conduct during 75° of each half wave pulse.

When source 46 is activated, the transistors Q2 and Q3 act to insure that the control electrode of SCR2 will always be a "0" state. When the small rectified current flows through LED1 some flows through resistor R6 and through the base emitter circuit of transistor Q2. Some of such current also flows through resistor R1, diode D7, resistor R7 and R8 to ground. Transistor Q3 is initially held off thereby permitting Q2 to conduct which holds the control electrode of SCR2 at a "0" potential state. Conduction of Q2 thus inhibits SCR2 from conducting. As capacitor C3 charges from current flowing through resistor R7 the base of Q3 reaches a potential which renders it fully conducting. Full conduction of Q3 renders Q2 nonconducting until such time as source 46 is deactivated. Module 34 then fully controls the conduction of SCR2.

The resistor-capacitor pairs C5-R13 and R14-C6 act as loads for the resistor-diode pairs R9-D9 and R10-R10. Excess current beyond that needed to maintain the desired potential states at the terminal 12 and 13 of module 34 flows into the input terminals 12 and 13.

The use of R19 as shown insures when connections to terminals 24, 26, 28, 41, 42 and 44 are made or interrupted, as can occur in "plug-in" versions of the switch are used, that the channel input terminals 1 to 9 will be maintained at a very low potential relative to any potential that may exist at terminal 41. This insures that when the last mentioned connections are made that the potential state at output terminal will initially be "0" or low.

It will be apparent that in order to trigger switch 20 from an "off" to an "on", or alternatively from an "on" to an "off" condition that there must be a change in the unidirectional potential impressed at input terminal 41 from a "0" to "1", or in the alternative case from a "1" to "0" state. A number of different condition sensors such as proximity, retroflective, acoustic, and thermal sensors can be connected to the input terminals 41, 42 and 44 to provide such changes in potential states at terminal 41 and have at terminal 11 when the sensed condition exceeds or diminishes below preselected values. The thermal sensor 22 which will now be described shows one form that can be used to cause switch 20 to change its state.

The sensor 22 has a B+ input terminal 50 which is connected to the B+ terminal 44 in switch 20, a D.C. output terminal 52 which is connected to terminal 41 in switch 20, and a ground terminal 54 which is connected to terminal 42 in switch 20. Terminal 50 is connected to the B+ bias terminal of an operational amplifier OA, and in series with a capacitor C7 to ground. The inverting input terminal of OA is connected to the adjustable slider of a potentiometer POT which has its resistive element connected at its upper end in series with a resistor R15 to terminal 50 and at its lower end in series with a resistor R16 to ground. The non-inverting input terminal of OA is connected in series with a resistor R17 to terminal 50, and in series with a thermistor TH to ground terminal 54. A feed back resistor R18 is connected between the output terminal of OA and the inverting input terminal. The negative D.C. bias terminal of OA is connected to ground terminal 54 and also through a conductor 56 to ground terminal 42 of switch 20.

As thermistor TH is subjected to changing temperature its resistance correspondingly changes, thereby changing the D.C. potential at the non-inverting input terminal of operational amplifier OA. Let it be assumed that the thermistor is subjected to an increasing temperature. When the temperature reaches a predetermined value, as determined by the setting of the adjustable slider of potentiometer POT, the output terminal of OA shifts from a "low" or "0" potential state to a "high" or "1" potential state which is impressed through terminals 52 and 41 on terminal 11 of module 34. If terminal 14 was previously in a "0" state it will then be correspondingly shifted to a "1" state, or if previously in a "1" state to a "0" state, depending on whichever of the terminals 12 and 13 is active at the time and initially in a "1" state.

It will be appreciated from the foregoing that the A.C. source and load need only be reconnected from one to the other of the terminals 24 and 26 to change the switch operation from a "normally open" to a "normally closed" type of operation. There is no need to effect any internal reconnections within the switch 20 itself to afford change from normally open to normally closed type of operation and vice versa.

If by chance one end of the series connected A.C. source 46 and load 48 should be connected to both of the terminals 24 and 26, simultaneously, it is a feature of the present invention that terminal 14 of module 34 will go to a "0" or low state in which it becomes inhibited. Application of half wave potential pulses to terminals 12 and 13 simultaneously causes such "0" inhibition state at terminal 14, and it stays in that state regardless of any change of state from "0" to "1", or vice versa, at input terminals 11 and 41. This will only occur so long as both of the terminals 12 and 13 are simultaneously subjected to D.C. input potentials.

I claim:

1. A terminal convertible electric switch providing either "normally open" or "normally closed" operating states, in combination:
   (a) first and second A.C. terminals
   (b) a third common A.C. terminal
   (c) means connected to said first and second terminals and said third terminal and providing alternative first and second rectified unidirectional potentials whenever an A.C. source is connected between said third terminal and either of said first and second terminals
   (d) signal gating means having input terminals connected to the first mentioned means, a D.C. signal input terminal, and a D.C. output terminal that goes from a low to high potential state whenever said D.C. signal input terminal goes from a low to a high potential state and said first unidirectional potential is present, and conversely goes from a high to a low potential state when said second unidirectional potential is present when the aforementioned change in potential state occurs at said D.C. signal input terminal
   (e) and means responsive to said gating means D.C. output terminal going from a low to high potential state, and vice versa, to energize and deenergize a load connected between whichever of said first and second A.C. terminal is connected with said third A.C. terminal to an A.C. supply source.

2. A terminal convertible electric switch according to claim 1 wherein said signal gating means is effective whenever both of said first and second unidirectional potentials are present to inhibit any change in state of the potential at its D.C. output terminal in response to changes in potential state at its D.C. signal input terminal.

3. A terminal convertible electric switch according to claim 1 wherein the last specified means includes a unidirectional thyristor which is rendered conducting when said gating means output terminal goes from a low to a high potential state to provide a low impedance circuit path between whichever of said first or second A.C. terminals and said third A.C. terminal a load and an A.C. source are connected.

4. A terminal convertible electric switch according to claim 3 together with rectifier means which provides said first and second unidirectional potentials to said signal gating means in accordance with which of said first or second A.C. terminals together with said third common terminal an A.C. source and a load are connected to an A.C. supply source, and additional rectifier means which establishes a unidirectional path through said thyristor and an interconnecting bidirectional path for said A.C. source and load.

5. A terminal convertible switch in accordance with claim 4 wherein said last specified means also includes means providing a unidirectional bias to said gating means, and means responsive to said output terminal going from a low to a high potential state to trigger said thyristor into conduction.

6. A terminal convertible electric switch according to claim 3 including an electro-luminous indicating means which is energized whenever an A.C. supply source and load are connected between said third common A.C. terminal and either of said first and second A.C. terminals, and another electro-luminous indicating means which is energized whenever said thyristor is conducting.

7. A terminal convertible electric switch according to claim 3 wherein said last specified means includes a second unidirectional thyristor having its main conducting path in circuit with the control electrode of the first specified thyristor and its control electrode connected to the D.C. output terminal of said signal gating means, said second thyristor being rendered conducting following change of potential state from low to high at said D.C. output terminal of said gating means to trigger said first mentioned thyristor into conduction.

8. A terminal convertible electric switch according to claim 7 wherein transistor means are connected in circuit with the control electrode of said second thyristor which act to inhibit a conduction potential developing on such control electrode when either of said first and second unidirectional potentials is initially applied until the D.C. output terminal of said signal gating means has established the output state called for by the potential state at the signal input terminal of the latter.

9. A terminal convertible electric switch according to claim 7 wherein a transistor has its emitter-collector circuit connected between the cathode of said second thyristor and the control electrode of said first mentioned thyristor, and having its base connected in series with a zener diode to said common A.C. terminal, said emitter of said transistor also being connected to receive reduced current from the then active one of said separate unidirectional potentials whenever said second thyristor is nonconducting, and having connection through a resistor to the point common between its base and the cathode of said zener diode to act as a bias regulator for the unidirectional potential applied to said signal gating means.

* * * * *